US010085094B2

(12) United States Patent
Cargill et al.

(10) Patent No.: US 10,085,094 B2
(45) Date of Patent: Sep. 25, 2018

(54) MEMS DEVICES AND PROCESSES

(71) Applicant: Cirrus Logic International Semiconductor Ltd., Edinburgh (GB)

(72) Inventors: Scott Lyall Cargill, Edinburgh (GB); Colin Robert Jenkins, Linlithgow (GB); Euan James Boyd, Edinburgh (GB)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 15/636,121

(22) Filed: Jun. 28, 2017

(65) Prior Publication Data

US 2018/0007474 A1 Jan. 4, 2018

(30) Foreign Application Priority Data

Jun. 30, 2016 (GB) .................................. 1611400.1
Jun. 30, 2016 (WO) ................ PCT/GB2016/051973

(51) Int. Cl.
| | |
|---|---|
| *H04R 19/04* | (2006.01) |
| *B81B 3/00* | (2006.01) |
| *B81C 1/00* | (2006.01) |
| *H04R 7/18* | (2006.01) |
| *H04R 19/00* | (2006.01) |

(52) U.S. Cl.
CPC ........... *H04R 19/04* (2013.01); *B81B 3/0072* (2013.01); *B81C 1/00666* (2013.01); *H04R 7/18* (2013.01); *H04R 19/005* (2013.01); *B81B 2201/0257* (2013.01); *B81B 2203/0315* (2013.01)

(58) Field of Classification Search
CPC .... H04R 19/005; H04R 19/04; H04R 31/006; H04R 7/10; H04R 7/18; H04R 7/06; H04R 7/122
See application file for complete search history.

(56) References Cited

U.S. PATENT DOCUMENTS

| | | | |
|---|---|---|---|
| 8,942,394 B2* | 1/2015 | Conti ....................... | H04R 7/24 381/174 |
| 2010/0329487 A1* | 12/2010 | David ..................... | H03F 3/187 381/174 |
| 2011/0150261 A1 | 6/2011 | Ho et al. | |
| 2014/0084396 A1* | 3/2014 | Jenkins ................. | B81B 3/0021 257/419 |
| 2015/0078592 A1 | 3/2015 | Uchida | |

(Continued)

FOREIGN PATENT DOCUMENTS

CN 204031450 U 12/2014

OTHER PUBLICATIONS

International Search Report and Written Opinion of the International Search Authority, International Application No. PCT/GB2016/051973, dated Mar. 17, 2017.

(Continued)

*Primary Examiner* — Mohammad Islam
(74) *Attorney, Agent, or Firm* — Jackson Walker L.L.P.

(57) ABSTRACT

A MEMS transducer structure comprises a substrate comprising a cavity. A membrane layer is supported relative to the substrate to provide a flexible membrane. A peripheral edge of the cavity defines at least one perimeter region that is convex with reference to the center of the cavity. The peripheral edge of the cavity may further define at least one perimeter region that is concave with reference to the center of the cavity.

39 Claims, 11 Drawing Sheets

(56) References Cited

U.S. PATENT DOCUMENTS

| | | | | |
|---|---|---|---|---|
| 2015/0256915 A1* | 9/2015 | Hoekstra | ............. | H04R 19/005 |
| | | | | 257/416 |
| 2015/0256924 A1* | 9/2015 | Hoekstra | ............. | H04R 19/005 |
| | | | | 257/416 |
| 2015/0369653 A1* | 12/2015 | Inoue | .................... | G01H 11/06 |
| | | | | 381/113 |
| 2017/0121173 A1* | 5/2017 | Hoekstra | ............... | B81B 7/0077 |
| 2017/0217762 A1* | 8/2017 | Hoekstra | ............... | B81B 7/0061 |

OTHER PUBLICATIONS

Combined Search and Examination Report under Sections 17 and 18(3), Application No. GB1611400.1, dated Aug. 16, 2016.

\* cited by examiner

MEMS DEVICES AND PROCESSES

TECHNICAL FIELD

The embodiments of the present invention relate to micro-electro-mechanical system (MEMS) devices and processes, and in particular to a MEMS device and process relating to a transducer, for example a capacitive microphone.

BACKGROUND

Various MEMS devices are becoming increasingly popular. MEMS transducers, and especially MEMS capacitive microphones, are increasingly being used in portable electronic devices such as mobile telephone and portable computing devices.

Microphone devices formed using MEMS fabrication processes typically comprise one or more moveable membranes and a static backplate, with a respective electrode deposited on the membrane(s) and backplate, wherein one electrode is used for read-out/drive and the other is used for biasing, and wherein a substrate supports at least the membrane(s) and typically the backplate also. In the case of MEMS pressure sensors and microphones the read out is usually accomplished by measuring the capacitance between the membrane and backplate electrodes. In the case of transducers, the device is driven, i.e. biased, by a potential difference provided across the membrane and backplate electrodes.

FIGS. 1a and 1b show a schematic diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 103 is mechanically coupled to the flexible membrane, and together they form a first capacitive plate of the capacitive microphone device. A second electrode 102 is mechanically coupled to a generally rigid structural layer or backplate 104, which together form a second capacitive plate of the capacitive microphone device. In the example shown in FIG. 1a the second electrode 102 is embedded within the backplate structure 104.

The capacitive microphone is formed on a substrate 105, for example a silicon wafer, which may have upper and lower oxide layers 106, 107 formed thereon. A cavity or through-hole 108 in the substrate and in any overlying layers (hereinafter also referred to as a substrate cavity) is provided below the membrane, and may be formed for example using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

A plurality of holes, hereinafter referred to as bleed holes 111, connect the first cavity 109 and the second cavity 110.

A further plurality of holes, hereinafter referred to as acoustic holes 112, are arranged in the back-plate 104 so as to allow free movement of air molecules through the back plate, such that the second cavity 110 forms part of an acoustic volume with a space on the other side of the back-plate. The membrane 101 is thus supported between two volumes, one volume comprising cavities 109 and substrate cavity 108 and another volume comprising cavity 110 and any space above the back-plate. These volumes are sized such that the membrane can move in response to the sound waves entering via one of these volumes. Typically the volume through which incident sound waves reach the membrane is termed the "front volume" with the other volume, which may be substantially sealed, being referred to as a "back volume".

In some applications the backplate may be arranged in the front volume, so that incident sound reaches the membrane via the acoustic holes 112 in the backplate 104. In such a case the substrate cavity 108 may be sized to provide at least a significant part of a suitable back-volume.

In other applications, the microphone may be arranged so that sound may be received via the substrate cavity 108 in use, i.e. the substrate cavity forms part of an acoustic channel to the membrane and part of the front volume. In such applications the backplate 104 forms part of the back-volume which is typically enclosed by some other structure, such as a suitable package.

It should also be noted that whilst FIG. 1 shows the backplate 104 being supported on the opposite side of the membrane to the substrate 105, arrangements are known where the backplate 104 is formed closest to the substrate with the membrane layer 101 supported above it.

In use, in response to a sound wave corresponding to a pressure wave incident on the microphone, the membrane is deformed slightly from its equilibrium position. The distance between the lower electrode 103 and the upper electrode 102 is correspondingly altered, giving rise to a change in capacitance between the two electrodes that is subsequently detected by electronic circuitry (not shown). The bleed holes allow the pressure in the first and second cavities to equalise over a relatively long timescales (in acoustic frequency terms) which reduces the effect of low frequency pressure variations, e.g. arising from temperature variations and the like, but without significantly impacting on sensitivity at the desired acoustic frequencies.

One skilled in the art will appreciate that MEMS transducers are typically formed on a wafer before being singulated. Increasing it is proposed that at least some electronic circuitry, e.g. for read-out and/or drive of the transducer, is also provided as part of an integrated circuit with the transducer. For example a MEMS microphone may be formed as an integrated circuit with at least some amplifier circuitry and/or some circuitry for biasing the microphone. The footprint of the area required for the transducer and any circuitry will determine how many devices can be formed on a given wafer and thus impact on the cost of the MEMS device. There is therefore a general desire to reduce the footprint required for fabrication of a MEMS device on a wafer.

In addition to be suitable for use in portable electronic devices such transducers should be able to survive the expected handling and use of the portable device, which may include the device being accidentally dropped.

If a device such as a mobile telephone is subject to a fall, this can result not only in a mechanical shock due to impact but also a high pressure impulse incident on a MEMS transducer. For example, a mobile telephone may have a sound port for a MEMS microphone on one face of the device. If the device falls onto that face, some air may be compressed by the falling device and forced into the sound port. This may result in a high pressure impulse incident on the transducer. It has been found that in conventional MEMS transducers high pressure impulses can potentially lead to damage of the transducer.

To help prevent any damage which may be caused by these high pressure impulses it has been proposed that the MEMS transducer could be provided with variable vents which can provide a flow path between the front and back volumes that has a size that can vary in use. In a high pressure situation the variable vent(s) provide a relatively large flow path between the volumes so as to provide for relatively rapid equalisation between the volumes, reducing the extent and/or duration of a high pressure event on the membrane. At lower pressures however, within the expected normal operating range of the transducer, the size of the flow path, if any, is smaller.

The variable vent structure thus acts as a type of pressure relief valve to reduce the pressure differential acting on the membrane at relatively high pressure differentials. However unlike, the bleed holes which may be present in the membrane which have a fixed area and thus a fixed size of flow path, the variable vent has a flow path size which varies in response to a pressure differential. Thus the degree to which the variable vent allows venting depends on the pressure differential acting on the vent—which clearly depends on the pressure of at least one of the first and second volumes. The variable vent therefore provides a variable acoustic impedance.

It will be appreciated that, in the membrane layer of a MEMS transducer, a material is said to be under stress when its atoms are displaced from their equilibrium positions due to the action of a force. Thus, a force that increases or decreases the interatomic distance between the atoms of the membrane layer gives rise to stress within the membrane. For example, the membrane layer exhibits an inherent, or intrinsic, residual stress when at equilibrium (i.e. when no or negligible differential pressure arises across the membrane). Furthermore, stresses can arise in the membrane layer e.g. due to the way in which the membrane is supported in a fixed relation to the substrate or due to an acoustic pressure wave incident on the membrane.

MEMS transducers according to the present invention are intended to respond to the acoustic pressure waves which give rise to transient stress waves on the membrane surface. Thus, it will be appreciated that the stresses exhibited within a membrane layer, both when at equilibrium and when moving during use, may potentially have a detrimental impact on the performance of a transducer, as described below.

FIG. 2 shows a cross-sectional view through a typical transducer structure. The transducer structure comprises a membrane 101 which is moveable during use in relation to a rigid backplate 104. The membrane 101 and backplate 104 are supported by a substrate 105, the substrate 105 comprising a cavity or though-hole 108. Electrodes and other features are not shown in FIG. 2 for clarity purposes.

Referring to FIG. 3, during movement of the membrane 101 during use, and in particular during high input acoustic pressure, or extreme conditions such as a mobile device being dropped, it is possible that the membrane 101 makes contact with the substrate 105 which provides support for the membrane. For example, the membrane 101 can make contact with a peripheral edge of the substrate 105 that forms the cavity within the substrate, as illustrated by the arrow 30.

Embodiments of the present invention are generally concerned with improving the efficiency and/or performance of a transducer structure. Aspects of the present invention are also concerned with alleviating and/or redistributing stresses within the membrane layer, including when a membrane moves or flexes during use.

Aspects of the present invention are also directed to alleviating and/or diffusing and/or redistributing stress arising in the membrane if the membrane is displaced during use such that the membrane makes contact with the substrate which supports the membrane.

SUMMARY

According to a first aspect, there is provided a MEMS transducer structure comprising a substrate, the substrate comprising a cavity. The MEMS transducer structure comprises a membrane layer supported relative to the substrate to provide a flexible membrane. A peripheral edge of the cavity defines at least one perimeter region that is convex with reference to the center of the cavity.

The MEMS transducer structure as defined above has an advantage that, should the membrane make contact during use with a peripheral edge of the cavity, the membrane makes contact at the convex portion first, prior to another portion of the peripheral edge of the cavity.

According to another aspect, there is provided a MEMS transducer structure comprising a substrate, the substrate comprising a cavity. The MEMS transducer structure comprises a membrane layer supported relative to the substrate to provide a flexible membrane, wherein the membrane layer comprises an active central region and a plurality of support arms which extend laterally from the active central region for supporting the active central region of the membrane. A peripheral edge of the cavity defines at least first and second perimeter regions that are concave with reference to the center of the cavity.

Features of any given aspect may be combined with the features of any other aspect and the various features described herein may be implemented in any combination in a given embodiment.

Associated methods of fabricating a MEMS transducer are provided for each of the above aspects.

BRIEF DESCRIPTION OF THE DRAWINGS

For a better understanding of the present invention, and to show how it may be put into effect, reference will now be made, by way of example to the accompanying drawings, in which.

DESCRIPTION

In transducers such as described above in relation to FIGS. 1a, 1b, 2 and 3, the membrane layer may be formed from a material such as silicon nitride and may be deposited to be have residual stress inherent in the membrane at equilibrium. The membrane is thus formed so as to be supported around substantially the whole of its periphery. The membrane can therefore be thought of as being under tension, akin to a drum skin stretched over a frame. To provide uniform behaviour and even stress distribution the membrane is thus typically formed as a generally circular structure.

Figure 1A:
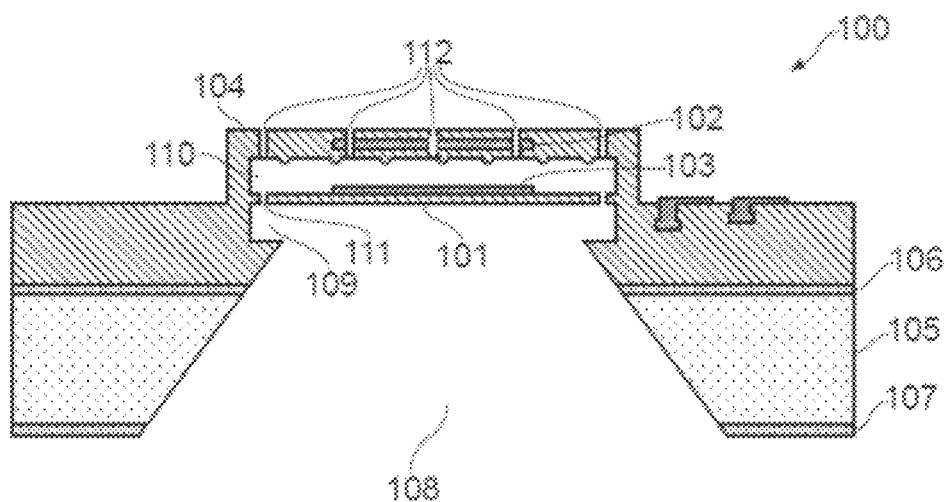
FIGS. 1a and 1b illustrate sectional and perspective views of a known MEMS microphone structure.
Figure 1B:
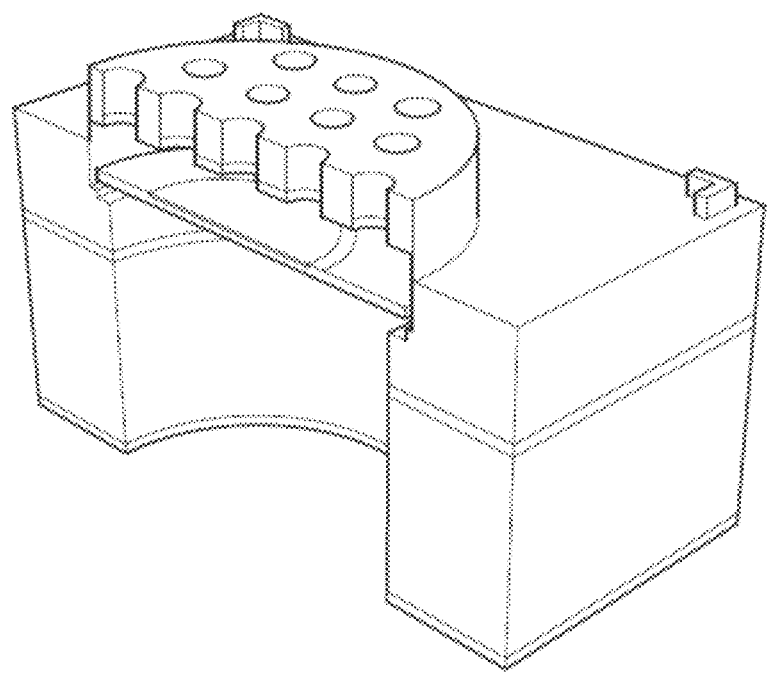
Figure 2:
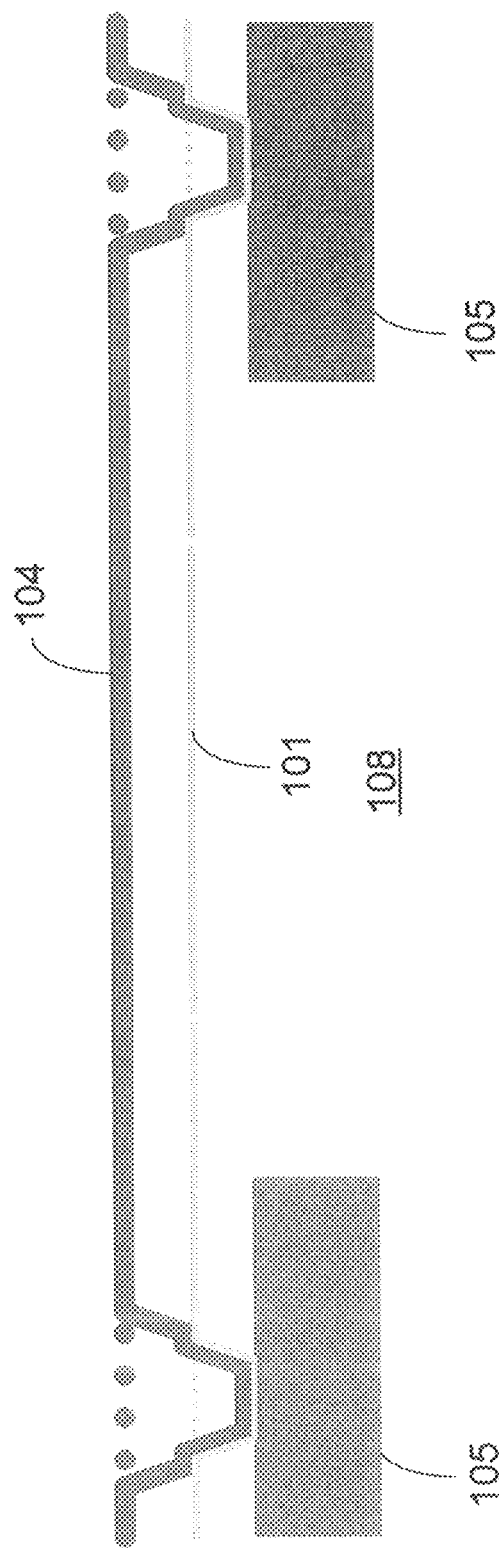
FIG. 2 illustrates a cross-sectional view through a MEMS transducer structure.
Figure 3:
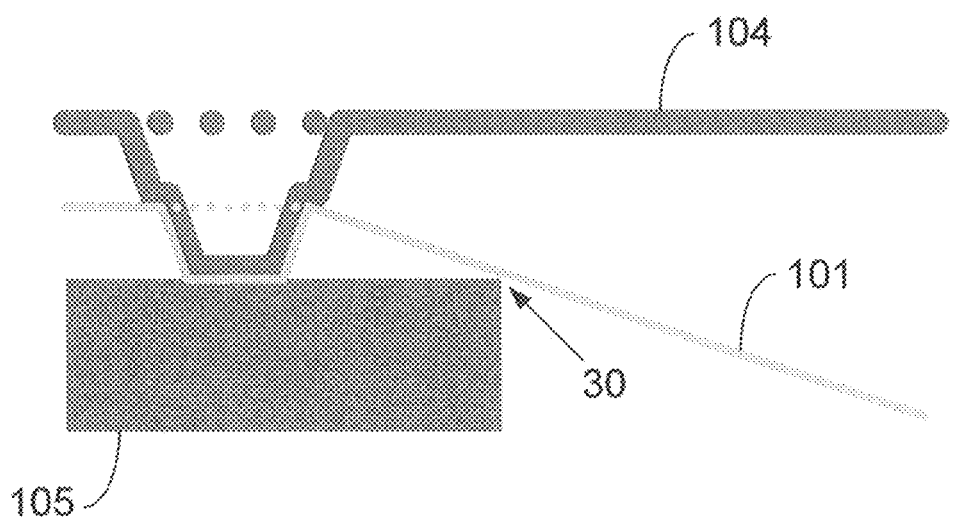
FIG. 3 illustrates deflection of a membrane in the MEMS transducer structure of FIG. 2.

For instance to form the transducer structure illustrated in FIG. 1a one or more base layers may be formed on the substrate 105 and then a layer of sacrificial material may be deposited and patterned to form a generally circular shape. The sacrificial material serves to define the space that will form cavity 109. One or more layers may then be deposited on the sacrificial material to form the membrane 101. The bleed holes 111 may be formed in the membrane layer along with any vent structures such as described with reference to FIGS. 2a or 2b. A further sacrificial material layer may then be deposited on top of the membrane and patterned to define cavity 110. The back plate layers can then deposited. To form the substrate cavity 108 a back etch may be performed. To ensure that it is the sacrificial material that defines cavity 109 and not the bulk back etch (which would be less accurate) it is ensured that the opening of the substrate cavity is smaller than cavity 109 and located within the area of the cavity 109. The sacrificial material can then be removed to leave cavities 109 and 110 and release the membrane. The membrane layer(s) thus extend into the side wall structure that also supports the back-plate. The flexible membrane itself is supported and constrained on all sides and is substantially circular in shape.

Whilst this type of process produces good device properties the use of circular membranes tends to result in some inefficiency in the use of the silicon wafer.

For various reasons it is most usual and/or cost effective to process areas of silicon in generally rectangular blocks of area. Thus the area on a silicon wafer that is designated for the MEMS transducer is typically generally square or rectangular in shape. This area needs to be large enough to encompass the generally circular transducer structure. This tends to be inefficient in terms of use of the silicon wafer as the corner regions of this designated transducer area are effectively unused. This limits the number of transducer structures and circuits that can be fabricated on a given wafer. It would of course be possible to fit more transducers on a wafer by reducing the size of the transducer but this would have any impact on resulting sensitivity and thus is undesirable.

In the embodiments described herein the transducer is based on a design that more efficiency utilises a generally rectangular or square area. This design requires less area for a given transducer sensitivity than an equivalent circular design.

Figure 4:
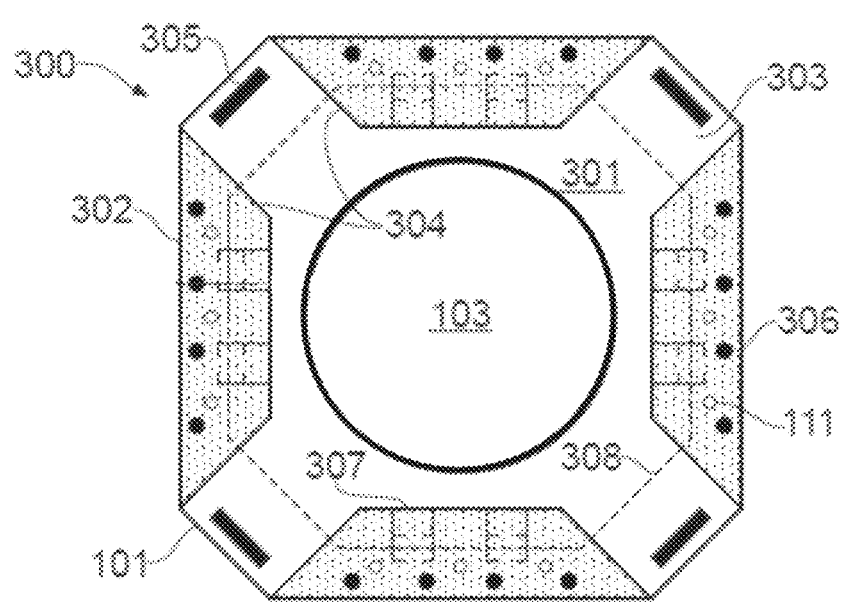
FIG. 4 illustrates a plan view of a MEMS transducer structure.

FIG. 4 illustrates an example of a transducer 300, whereby instead of having a circular membrane a different shape is used. FIG. 4 illustrates the transducer membrane 101 and thus represents a section through the transducer although the backplate may have substantially the same shape. The membrane is not substantially circular and instead, in this example, has a polygon shape. In general the membrane has a shape that would substantially fill a square area defined by the perimeter of the membrane. In other words if one were to consider the smallest possible square area that would completely contain the membrane 101 then the membrane would cover a large proportion of such an area, for example the membrane may cover at least 90% of such a square area. It will be appreciated that for a circular membrane of diameter D the smallest such square area would have a side D. The area of the circle ($\pi \cdot D^2/4$) would thus cover about 78% of the area of such a square ($D^2$).

The whole area illustrated in FIG. 4 is provided with a layer of membrane material. However in the example illustrated in FIG. 4 the layer of membrane material is divided into a first membrane region 301, which will be referred to herein as an active membrane region or just as active membrane, and a plurality of second regions 302 which will be referred to as inactive membrane regions or inactive membrane. The inactive membrane regions 302 are illustrated by the shaded regions in FIG. 4, with the unshaded area corresponding to the active membrane 301.

The active membrane thus comprises a central area, e.g. where the membrane electrode 103 will be located, which is supported by a plurality of arms 303. In some embodiments the arms may be distributed substantially evenly around the periphery of the membrane. A generally even distribution of arms may help avoid unwanted stress concentration. In the example illustrated in FIG. 4 there are four arms 303 and thus four separate regions of inactive membrane 302, but it will be appreciated that there may be more or fewer arms in other embodiments, although preferably there will be at least three arms.

Figure 5:
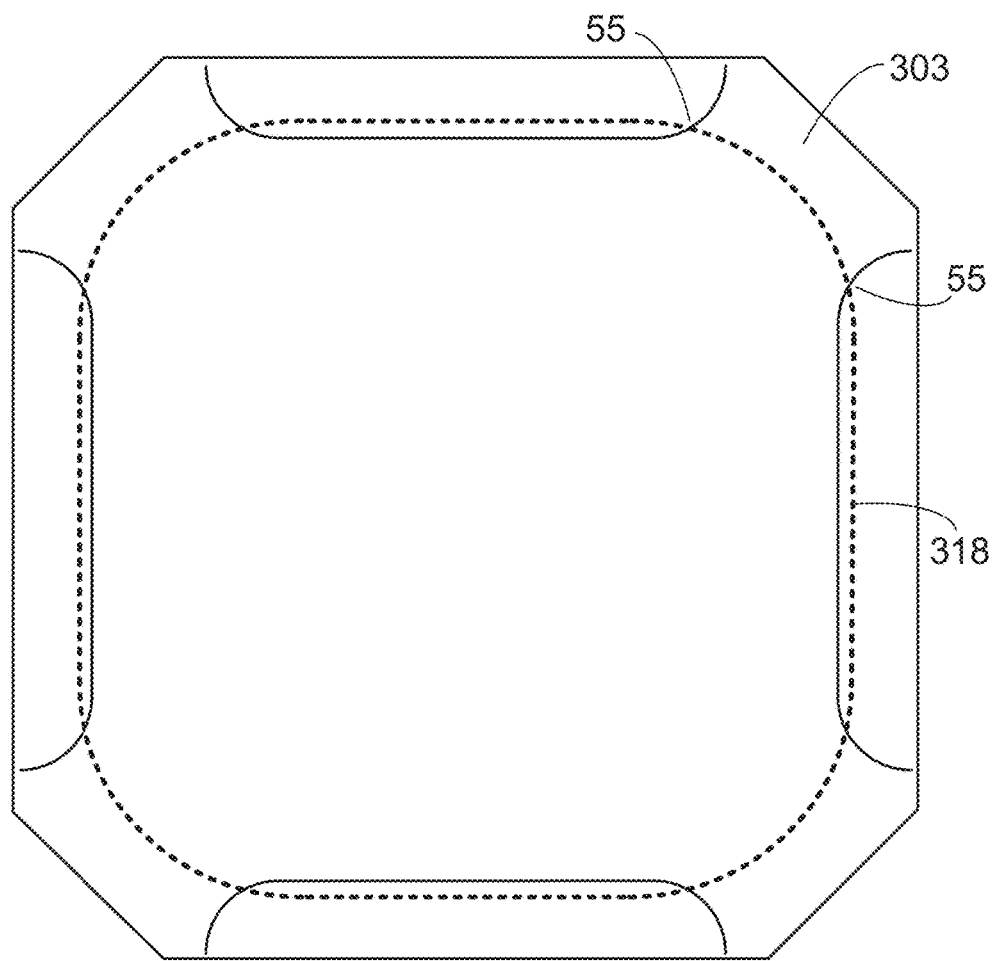
FIG. 5 illustrates a plan view of a MEMS transducer structure.

There are thus one or more channels or gaps 304 between the material of the active membrane 301 and the inactive membrane regions 302. Conveniently during manufacture a continuous layer of membrane material may be deposited and then the channels 304 may be etched through the membrane material to form the active and inactive regions. The channel may be shaped such that the side edges of the arms exhibit a smooth, or continuous, profile rather than being formed of one or more straight lines. This is illustrated in FIG. 5 described later.

Each arm 303 of the active membrane region 301 may comprise at least one mount 305 for supporting the membrane layer of the active region 301 with respect to the substrate and also possibly a backplate. There may also be mounts 306 within the inactive membrane regions for supporting the inactive membrane region.

The mounts 305 and 306 may take various forms. For instance the mount could comprise a sidewall of the transducer structure and the membrane layer may extend into the sidewall. In some examples however the mount may be a region where the membrane material makes contact with the substrate or a support structure that rises from the substrate. The mount may also comprise an area where the support structure for the backplate makes contact with the membrane. The membrane at the mount is thus effectively held in place and prevented from any substantial movement with respect to the substrate and/or backplate.

The material of the membrane layer can thus be deposited within intrinsic stress as described previously. The plurality of arms of the active region 301 all radiate generally away from the centre of the active membrane and thus can act to keep the membrane effectively in tension. As mentioned the arms may be evenly spaced around the active membrane. In addition the mounting points for the active membrane 301, e.g. mounts 305 may all be substantially equidistant from the centre of the active membrane—even with a generally square membrane layer. This is possible because the membrane material at the 'sides' of the square arrangement have been separated into inactive membrane regions that are not directly connected to the active membrane region. This arrangement thus means that the distribution of stress in the central portion of the active membrane is generally even, both at equilibrium and when the active membrane is deflected by an incident pressure stimulus, with most of any stress modulation being instead in the arms. The active membrane will thus behave in a similar way to a circular membrane which is constrained all around its periphery. This would not be the case were a square membrane, or the polygon membrane illustrated in FIG. 4, bounded on all sides.

Such a design is advantageous as it provides an active membrane area that has a similar response to a circular membrane with a radius equal to the distance between the centre of the active membrane and the mounts 305 of the arms. However to fabricate such a corresponding circular membrane transducer would require a larger rectangular area of the substrate. By using a design such as illustrated in FIG. 4 the area required for the transducer on a wafer may therefore be reduced compared to a circular membrane of similar performance.

However, when a MEMS transducer of this type is subject to stress conditions, such as a high acoustic signal, including for example when a portable device comprising the MEMS transducer is dropped, the membrane can deflect to such an extent that the active membrane area makes contact with the substrate supporting the membrane. Referring to FIG. 4, it will be appreciated that as each arm 303 of the active membrane region 301 deflects towards the supporting substrate, upon extreme conditions each arm 303 will make contact with an edge of the substrate when the cavity or through hole is formed, the edge of the cavity illustrated by the dotted line 308.

FIG. 5 illustrates this point further, showing that an initial contact point between the active membrane area and the edge 318 of the cavity is at the edges 55 of the supporting arms 303 of the active membrane area. This can result in the membrane becoming damaged if the supporting arms 303 of the active membrane area make contact with the edge 318 in the cavity of the supporting substrate.

This is particularly so in view of the membrane being under intrinsic stress, whereby the support arms 303 maintain the intrinsic stress in the active membrane.

Figure 6A:
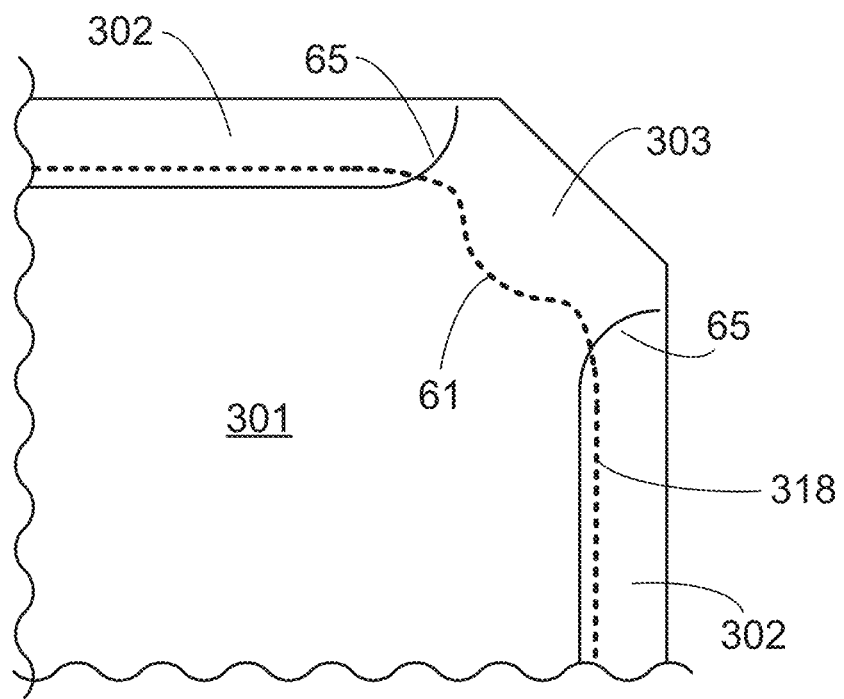
FIG. 6a illustrates a section of a MEMS transducer structure according to an embodiment.

FIG. 6a shows an example of MEMS transducer structure according to an embodiment. In FIG. 6a only a plan view of a section of the MEMS transducer is shown for purposes of clarity. FIG. 6a shows a plan view of a membrane layer of the transducer structure, for example similar to that of FIG. 4 having an active center region 301 and a plurality of supporting arms 303 (one of which being shown in this section), with inactive membrane regions 302. The peripheral edge 318 of the underlying cavity within the substrate which supports the membrane is shown in dotted lines. It will be appreciated that since FIG. 6a represents a sectional view through the membrane layer, the MEMS transducer structure may comprise other features, such as a rigid backplate (not shown).

Thus, according to an embodiment, a MEMS transducer structure comprises a substrate, the substrate comprising a cavity. A membrane layer is supported relative to the substrate to provide a flexible membrane. A peripheral edge 318 of the cavity defines at least one perimeter region 61 that is convex with reference to the center of the cavity.

It is noted that references herein to the center of a cavity are intended to refer to a center of a plane across the cavity parallel to the undistorted membrane.

It is also noted that references herein to the term convex are intended to cover perimeter regions that are not only curved paths that provide a convex shape (i.e. an outline or surface that is smooth or a continuous curve like the exterior of a circle or sphere), but also perimeter regions comprising at least first and section linear sections that meet at one or more points to define a convex region. The term convex is also intended to comprise a perimeter region having a plurality of bitwise linear sections, which together form a convex region or form a convex curved path. As such, in the embodiment of FIG. 6a, and the other embodiments described herein, a convex portion may comprise a curved path, or a series of two or more bitwise linear portions.

The convex portion 61 of the perimeter region in the peripheral edge of the cavity has the advantage that, should the flexible membrane deflect significantly towards the underlying substrate and cavity during use, for example in response to a high acoustic input signal, or a device being dropped, a center region of the supporting arm 303 (across the width of the support arm 303) will make contact with the convex portion 61 in the peripheral edge of the cavity in the substrate, prior to the edges 65 of the supporting arm 303 making contact with the peripheral edge. In this way, since the center region of the support arm 303 makes contact first, this inherently stronger center region absorbs the energy, thus reducing the likelihood of the membrane tearing or being damaged at its edges.

In the embodiment of FIG. 6a the convex portion 61 of the peripheral edge 318 of the cavity underlies a center region of a support arm 303 of the membrane.

Figure 6B:
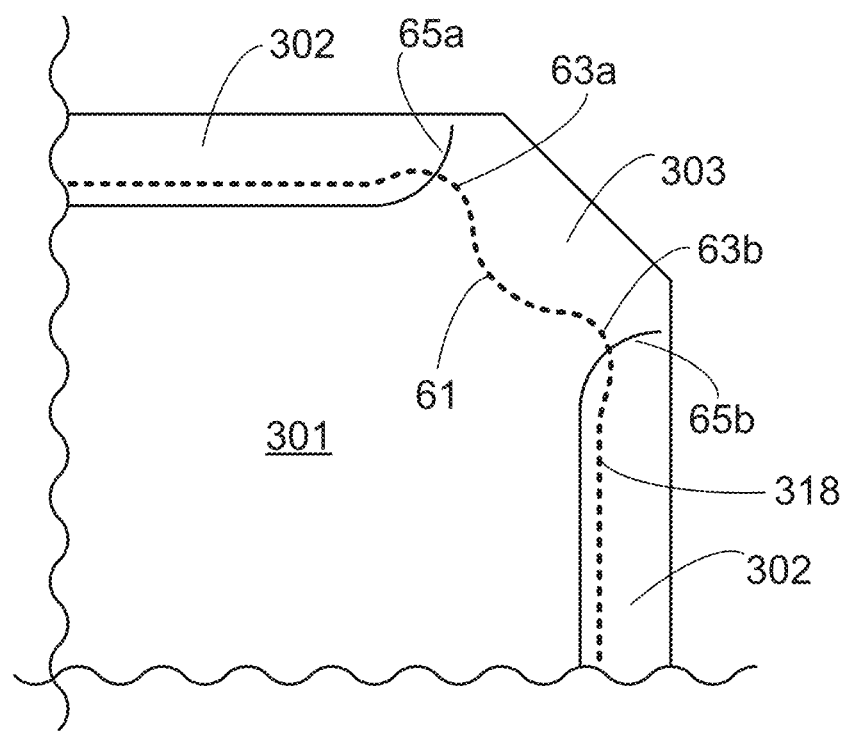
FIG. 6b illustrates a section of a MEMS transducer device according to another embodiment.

Referring to FIG. 6b, according to another embodiment. As with FIG. 6a, a convex portion 61 of the peripheral edge of the cavity underlies a center region of a support arm 303 of the membrane. As mentioned above, upon a significant deflection of the membrane during use, this means that a relatively strong part of the membrane first makes contact with the cavity edge 318.

In addition, the peripheral edge 318 of the cavity in FIG. 6b further defines at least one perimeter region 63 that is concave with reference to the center of the cavity.

It is noted that, in a similar manner to the term convex as described above, references herein to the term concave are intended to cover perimeter regions that are not only curved paths that provide a concave shape (i.e. an outline or surface that is curved inwards like the interior of a circle or sphere), but also perimeter regions comprising at least first and section linear sections that meet at one or more points to provide a concave region. The term concave is also intended to comprise a perimeter region having a plurality of bitwise linear sections, which together form a concave region. As such, in the embodiment of FIG. 6b, and the other embodiments described herein, a concave portion may comprise a curved path, or a series of two or more bitwise linear portions.

In an example such as that shown in FIG. 6b, the membrane comprises an active central region and a plurality of support arms 303 (one of which being shown for clarity) which extend laterally from the active central region for supporting the active central region of the membrane.

The apex of a convex portion 61 may substantially underlie the center of a supporting arm 303 in a width wise direction.

The perimeter region, which is concave, comprises concave portions 63a and 63b of the peripheral edge of the cavity underlie the edges of the support arm 303 (the edges 65a, 65b, being the slits between the support arms 303 of the active portion of the membrane and the inactive portions 302 of the membrane layer, as explained earlier with reference to FIG. 4).

This has an advantage that a relatively weak part of the membrane (i.e. the edges 65a, 65b of the support arms 303)

are less likely to make contact with the cavity edge 318, or if contact is made, the stronger convex portion 61 will have first diffused most of the force or energy from the impact.

Therefore, according to some embodiments the convex portion is positioned around the periphery of the cavity such that, upon deflection of the flexible membrane during use towards the cavity, the flexible membrane makes contact with the convex portion of the peripheral edge of the cavity prior to another portion of the peripheral edge of the cavity.

For example, with a membrane of the type having an active membrane region supported by a plurality of support arms, the convex portion is positioned around the periphery of the cavity such that, upon deflection of the flexible membrane during use towards the cavity, a center region of the supporting arm of the flexible membrane makes contact with the convex portion on the peripheral edge of the cavity prior to an edge region of the supporting arm.

According to embodiments of the invention the concave portion (for example concave portions 63a, 63b) is positioned around the periphery of the cavity such that, upon deflection of the flexible membrane during use towards the cavity, the flexible membrane makes contact with the concave portion later than another portion of the peripheral edge of the cavity.

For example, with a membrane of the type having an active membrane region supported by a plurality of support arms, in general terms the concave portion is positioned around the periphery of the cavity such that, upon deflection of the flexible membrane during use towards the cavity, an edge of a supporting arm of the flexible membrane makes contact with the concave portion on the peripheral edge of the cavity later than a center region of the supporting arm.

The embodiment of FIG. 6b shows a MEMS structure in which first and second concave portions 63a, 63b are positioned or configured around the periphery of the cavity such that, upon deflection of the flexible membrane during use towards the cavity, first and second edges 65a, 65b of a supporting arm 303 of the flexible membrane make contact with the concave portions 63a, 63b on the peripheral edge of the cavity later than a center region of the supporting arm 303.

Figure 6C:
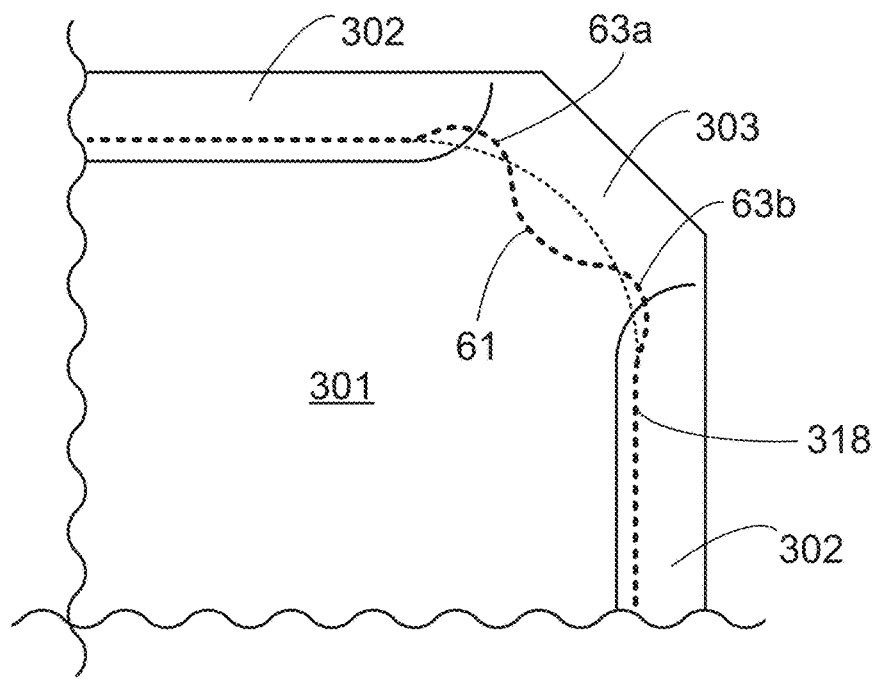
FIG. 6c illustrates a section of a MEMS transducer device according to another embodiment.

Referring to FIG. 6c, according to another aspect the cavity may be considered as having a nominal shape, for example a substantially circular, rectangular, pentagonal or octagonal shape. FIG. 6c shows a section taken from an example where the nominal shape of the cavity, illustrated by the thicker dotted line 318 on the sides and the thinner dotted line in the corner section, is similar to that of FIG. 5. In other words, the nominal shape of the cavity is a rectangular shaped cavity with curved corners. According to some embodiments, the periphery of the cavity can thus be defined as comprising a nominal shape, and wherein a convex portion 61 extends inwards towards the center of the cavity compared to the nominal shape of the cavity. In a similar manner, according to some embodiments the periphery of the cavity comprises a nominal shape, and wherein a concave portion(s) 63a, 63b, extends outwards away from the center of the cavity compared to the nominal shape of the cavity.

The concave portions 63a, 63b, may have a radius of curvature which is smaller than the radius of curvature of at least one other portion of the peripheral edge, for example a concave portion forming part of the nominal shape of the cavity.

Figure 6D:
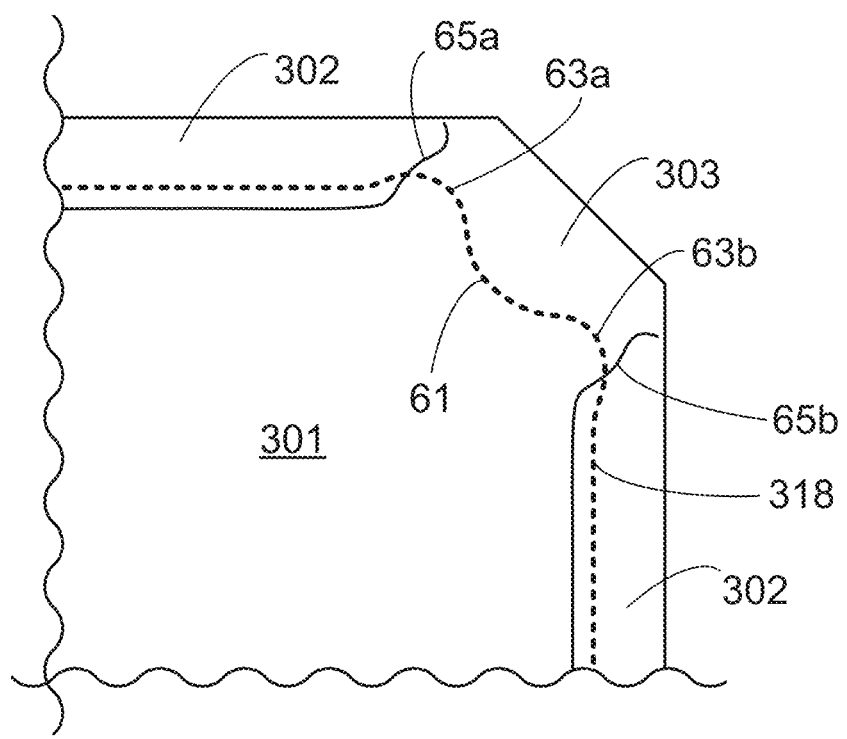
FIG. 6d illustrates a section of a MEMS transducer device according to another embodiment.

According to another aspect as illustrated in FIG. 6d, an edge portion of a supporting arm 303 may comprises a path segment comprising one or more bendpoints, for example an S-shaped curve 65. The one or more bendpoints or S-shaped curves 65a, 65b on the membrane overlie respective concave portions 63a, 63b on a peripheral edge of the cavity. Further details of this aspect, and the advantages thereof, can be found in greater detail in co-pending application P3087, relating to an interdigitated slit, being concurrently filed by the present Applicant.

In the co-pending application, there is defined a MEMS transducer comprising a flexible membrane supported at a supporting edge relative to a substrate. The flexible membrane comprises a first unbound edge, wherein the first unbound edge traces a path from a first endpoint at, or near, a first end of the supporting edge. A first path segment is defined between first and second path points on the first unbound edge, and wherein the first path segment traces a path which varies in distance from a straight line path between the first and second path points, the first path segment comprising at least two bendpoints at which the flexible membrane tends to bend in response to a given deflection of the flexible membrane.

Such a MEMS transducer may comprise a second unbound edge which traces a path from a first endpoint at, or near, a second end of the supporting edge, wherein a second path segment of the second unbound edge is defined between first and second path points on the second unbound edge, and wherein the second path segment traces a path which varies in distance from a straight line path between the first and second path points, the second path segment comprising one or more bendpoints at which the flexible membrane tends to bend in response to a given deflection of the flexible membrane.

According to another embodiment, a MEMS transducer may comprise a flexible membrane supported at a supporting edge relative to a substrate, the membrane comprising first and second unbound edges which each extend from an endpoint at, or near, first and second ends of the supporting edge respectively, wherein the first and second unbound edges each trace a path, a path segment being defined between first and second path points on each of the unbound edges, each path segment comprising at least two bendpoints at which the flexible membrane tends to bend in response to a given deflection of the flexible membrane.

Figure 7:
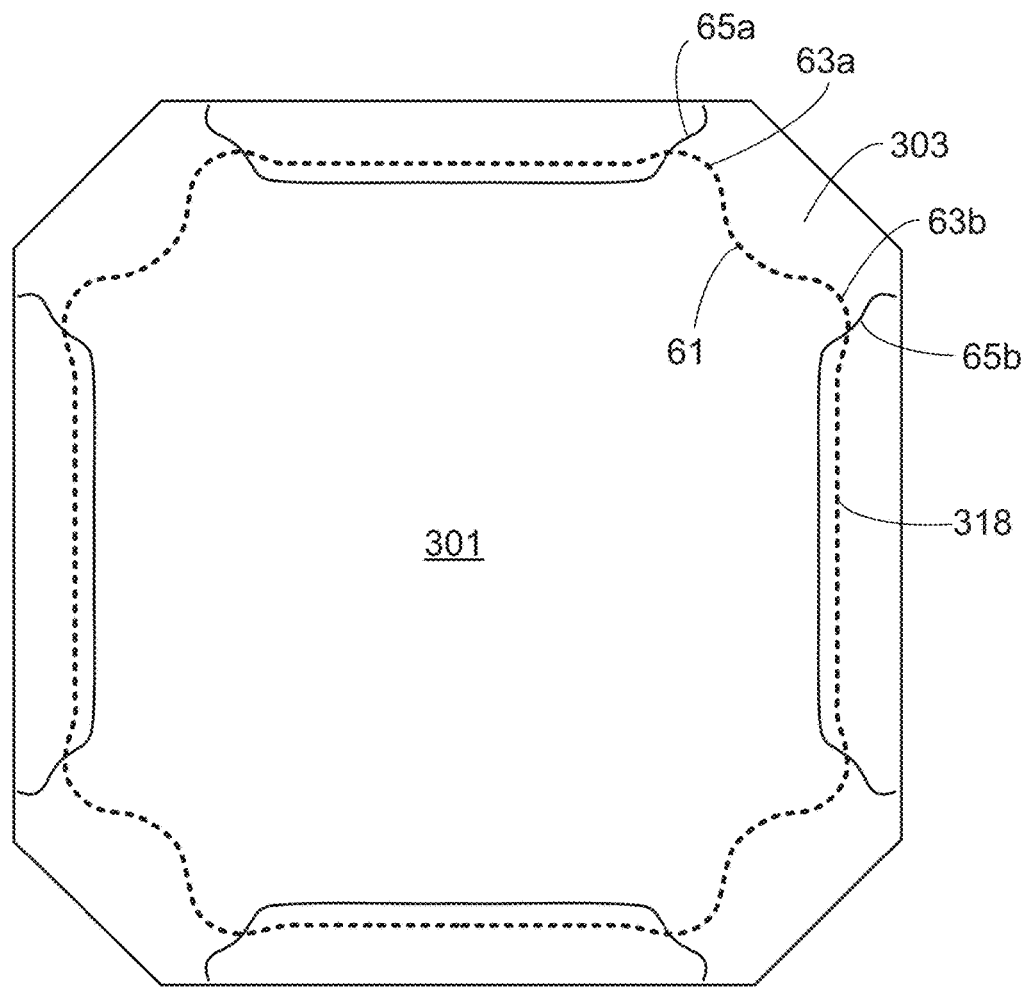
FIG. 7 is an example of a MEMS transducer device according to an embodiment.

FIG. 7 shows a full view of a MEMS transducer structure according to the embodiment of FIG. 6d, wherein the transducer comprises a substrate, the substrate comprising a cavity, the edge of the cavity illustrated by the dotted line 318. A membrane layer is supported relative to the substrate to provide a flexible membrane. In this example the membrane comprises an active central region 301 and a plurality of support arms 303 which extend laterally from the active central region for supporting the active central region of the membrane.

A peripheral edge 318 of the cavity defines at least one perimeter region 61 that is convex with reference to the center of the cavity.

The peripheral edge 318 of the cavity defines first and second concave portions 63a, 63b corresponding to each support arm 303, whereby the first and second concave portions 63a, 63b are positioned around the periphery of the cavity such that they underlie corresponding first and second edges 65a, 65b of a support arm 303.

The first and second concave portions 63a, 63b are positioned around the periphery of the cavity such that, upon deflection of the flexible membrane during use towards the cavity, first and second edges 65a, 65b of a supporting arm 303 of the flexible membrane make contact with the concave portions 63a, 63b on the peripheral edge of the cavity later than a center region of the supporting arm 303.

Furthermore, the embodiment of FIG. 7 comprises support arms 303 in which edge portions 65a, 65b of a support arm (303) comprises one or more bendpoints, for example an S-shaped curve. The one or more bendpoints or S-shaped curve (65a, 65b) on the membrane overlie a concave portion (63a, 63b) on a peripheral edge of the cavity.

Figure 8:
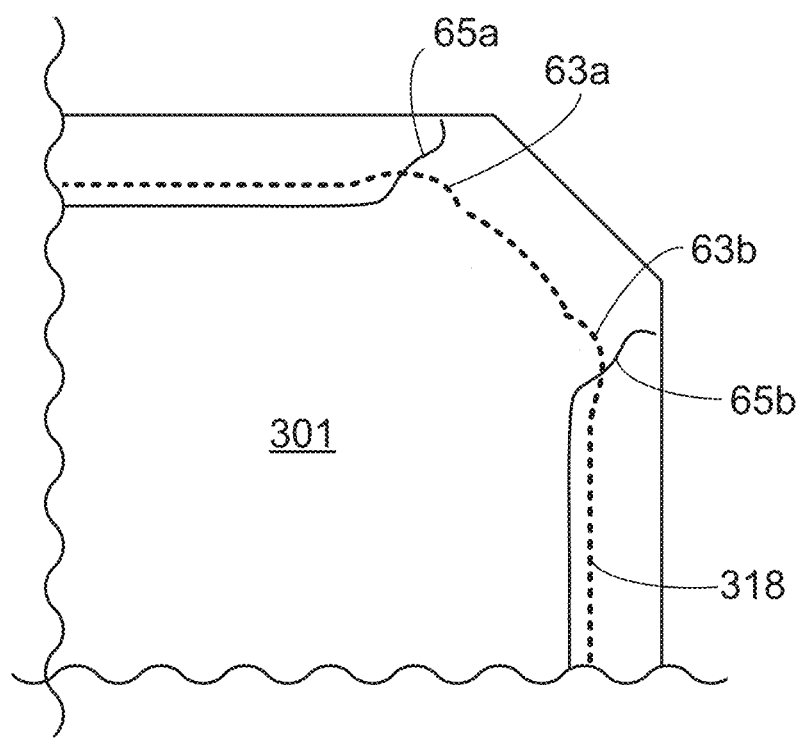
FIG. 8 illustrates a section of a MEMS transducer device according to an embodiment.

FIG. 8 describes an embodiment which is similar to FIG. 7, but which excludes the convex portion 61 of FIG. 7. There is therefore defined a MEMS transducer structure comprising a substrate, the substrate comprising a cavity, a membrane layer supported relative to the substrate to provide a flexible membrane, wherein the membrane layer comprises an active central region and a plurality of support arms 303 which extend laterally from the active central region for supporting the active central region of the membrane, and wherein a peripheral edge of the cavity defines at least first and second perimeter regions 63a, 63b that are concave with reference to the center of the cavity.

The first and second perimeter regions 63a, 63b, extend away from the centre of the cavity. The first and second perimeter regions 63a, 63b have a smaller radius of curvature compared to other concave portions of the peripheral edge of the cavity. The perimeter regions 63a, 63b underlie edges 65a, 65b on a support arm 303.

Such an embodiment also has the advantage of reducing the likelihood of the edges of a support arm making contact with an edge of the substrate.

From the above it can be seen that the embodiments described herein help reduce the stress and damage to a membrane layer in a MEMS transducer structure.

In the embodiments described herein, according to some examples the cavity comprises a though-hole through the substrate.

In the embodiments described herein, according to some examples the cavity forms part of a larger cavity within the substrate.

In the embodiments described herein, according to some examples the cavity is formed in a surface of the substrate corresponding to a side on which the membrane is supported.

The cavity may be formed, for example, using a sacrificial layer (for example when the cavity is similar to the type of cavity 109 shown in FIG. 1a).

In other examples the cavity is formed using an etching process, for example a back etch through the substrate.

The cavity may form part of a larger through-hole through the substrate. In some embodiments the periphery of the cavity and the periphery of the through-hole are the same shape. In other embodiments, the periphery of the cavity and the periphery of the through-hole are of different shapes.

In some examples the periphery of the cavity comprises at least one convex and concave portion, and wherein the periphery of the through-hole has a circular or rectangular or pentagonal or octagonal shape.

In an embodiment comprising a plurality of supporting arms, a corresponding plurality of convex and/or concave portions may be provides as described above. In an embodiment having a plurality of supporting arms, the supporting arms may be spaced evenly around the active central region of the membrane.

In some examples the membrane is generally square or rectangular in shape, and wherein an active center region of the membrane is under intrinsic stress.

In the embodiments described herein, a cross-section of the periphery of the cavity lies in a plane parallel to the surface of the substrate.

A MEMS transducer according to the embodiments described here may comprise a capacitive sensor, for example a microphone.

A MEMS transducer according to the embodiments described here may further comprise readout circuitry such as a low-noise amplifier, voltage reference and charge pump for providing higher-voltage bias, analogue-to-digital conversion or output digital interface or more complex analogue and/or digital processing or circuitry, or other components. There may thus be provided an integrated circuit comprising a MEMS transducer as described in any of the embodiments herein.

One or more MEMS transducers according to the embodiments described here may be located within a package. This package may comprise one or more sound ports. A MEMS transducer according to the embodiments described herein may be located within a package together with a separate integrated circuit comprising readout circuitry which may comprise analogue and/or digital circuitry such as a low-noise amplifier, voltage reference and charge pump for providing higher-voltage bias, analogue-to-digital conversion or output digital interface or more complex analogue or digital signal processing.

According to another aspect, there is provided an electronic device comprising a MEMS transducer according to any of the embodiments described herein. An electronic device may comprise, for example, at least one of: a portable device; a battery powered device; an audio device; a computing device; a communications device; a personal media player; a mobile telephone; a games device; and a voice controlled device.

According to another aspect, there is provided an integrated circuit comprising a MEMS transducer as described in any of the embodiments herein.

According to another aspect, there is provided a method of fabricating a MEMS transducer, wherein the MEMS transducer comprises a MEMS transducer as described in any of the embodiments herein.

Furthermore, in the embodiments described herein, it will be appreciated that a transducer may comprise other components, for example electrodes, or a backplate structure, wherein the flexible membrane layer is supported with respect to said backplate structure. The backplate structure may comprises a plurality of holes through the backplate structure.

Although the various embodiments describe a MEMS capacitive microphone, the invention is also applicable to any form of MEMS transducers other than microphones, for example pressure sensors or ultrasonic transmitters/receivers.

Embodiments of the invention may be usefully implemented in a range of different material systems, however the embodiments described herein are particularly advantageous for MEMS transducers having membrane layers comprising silicon nitride.

The MEMS transducer may be formed on a transducer die and may in some instances be integrated with at least some electronics for operation of the transducer.

In the embodiments described above it is noted that references to a transducer element may comprise various forms of transducer element. For example, a transducer element may comprise a single membrane and back-plate combination. In another example a transducer element comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprises different individual transducers positioned to receive acoustic signals from different acoustic channels.

It is noted that in the embodiments described herein a transducer element may comprise, for example, a microphone device comprising one or more membranes with electrodes for read-out/drive deposited on the membranes and/or a substrate or back-plate. In the case of MEMS pressure sensors and microphones, the electrical output signal may be obtained by measuring a signal related to the capacitance between the electrodes. However, it is noted that the embodiments are also intended to embrace the output signal being derived by monitoring piezo-resistive or piezo-electric elements or indeed a light source. The embodiments are also intended embrace a transducer element being a capacitive output transducer, wherein a membrane is moved by electrostatic forces generated by varying a potential difference applied across the electrodes, including examples of output transducers where piezo-electric elements are manufactured using MEMS techniques and stimulated to cause motion in flexible members.

It is noted that the embodiments described above may be used in a range of devices, including, but not limited to: analogue microphones, digital microphones, pressure sensor or ultrasonic transducers. The invention may also be used in a number of applications, including, but not limited to, consumer applications, medical applications, industrial applications and automotive applications. For example, typical consumer applications include portable audio players, wearable devices, laptops, mobile phones, PDAs and personal computers. Embodiments may also be used in voice activated or voice controlled devices. Typical medical applications include hearing aids. Typical industrial applications include active noise cancellation. Typical automotive applications include hands-free sets, acoustic crash sensors and active noise cancellation.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising: a substrate, the substrate comprising a cavity; and a membrane layer supported relative to the substrate to provide a flexible membrane, the membrane comprising an active central region and a plurality of support arms which extend laterally from the active central region for supporting the active central region of the membrane; wherein: a peripheral edge of the cavity defines at least one perimeter region that is convex with reference to the center of the cavity; and the convex portion is positioned around the periphery of the cavity such that, upon deflection of the flexible membrane during use towards the cavity, the flexible membrane makes contact with the convex portion of the peripheral edge of the cavity prior to another portion of the peripheral edge of the cavity.

2. A MEMS transducer as claimed in claim 1, wherein a convex portion of the peripheral edge of the cavity underlies a center region of a support arm of the membrane.

3. A MEMS transducer as claimed in claim 2, wherein the apex of a convex portion substantially underlies the center of a supporting arm in a width wise direction.

4. A MEMS transducer as claimed in claim 1, wherein a concave portion of the peripheral edge of the cavity underlies an edge of a support arm.

5. A MEMS transducer as claimed in claim 1, wherein a convex portion is positioned around the periphery of the cavity such that, upon deflection of the flexible membrane during use towards the cavity, a center region of the supporting arm of the flexible membrane makes contact with the convex portion on the peripheral edge of the cavity prior to an edge region of the supporting arm.

6. A MEMS transducer structure comprising:
a substrate, the substrate comprising a cavity; and
a membrane layer supported relative to the substrate to provide a flexible membrane;
wherein:
a peripheral edge of the cavity defines at least one perimeter region that is convex with reference to the center of the cavity;
the peripheral edge of the cavity further defines at least one perimeter region that is concave with reference to the center of the cavity; and
the concave portion is positioned around the periphery of the cavity such that, upon deflection of the flexible membrane during use towards the cavity, the flexible membrane makes contact with the concave portion later than another portion of the peripheral edge of the cavity.

7. A MEMS transducer as claimed in claim 6, wherein the concave portion is positioned around the periphery of the cavity such that, upon deflection of the flexible membrane during use towards the cavity, an edge of a supporting arm of the flexible membrane makes contact with the concave portion on the peripheral edge of the cavity later than a center region of the supporting arm.

8. A MEMS transducer as claimed in claim 7, comprising first and second concave portions positioned around the periphery of the cavity such that, upon deflection of the flexible membrane during use towards the cavity, first and second edges of a supporting arm of the flexible membrane make contact with the concave portions on the peripheral edge of the cavity later than a center region of the supporting arm.

9. A MEMS transducer as claimed in claim 1, wherein the periphery of the cavity comprises a nominal shape, and wherein a convex portion extends inwards towards the center of the cavity compared to the nominal shape of the cavity.

10. A MEMS transducer as claimed in claim 1, wherein the periphery of the cavity comprises a nominal shape, and wherein a concave portion extends outwards away from the center of the cavity compared to the nominal shape of the cavity.

11. A MEMS transducer as claimed in claim 1, wherein an edge portion of a supporting arm comprises one or more bendpoints or an S-shaped curve.

12. A MEMS transducer as claimed in claim 11, wherein the one or more bendpoints or S-shaped curve on the membrane overlie a concave portion on a peripheral edge of the cavity.

13. A MEMS transducer as claimed in claim 1, wherein a convex portion and/or a concave portion comprises a curved path, or a series of two or more bitwise linear portions.

14. A MEMS transducer as claimed in claim 1, wherein the cavity comprises a though-hole through the substrate.

15. A MEMS transducer as claimed in claim 1, wherein the cavity forms part of a larger cavity within the substrate.

16. A MEMS transducer as claimed in claim 1, wherein the cavity is formed in a surface of the substrate corresponding to a side on which the membrane is supported.

17. A MEMS transducer as claimed in claim 1, wherein the cavity is formed using a sacrificial layer.

18. A MEMS transducer as claimed in claim 1, wherein the cavity is formed using an etching process.

19. A MEMS transducer as claimed in claim 1, wherein the cavity forms part of a larger through-hole through the substrate.

20. A MEMS transducer as claimed in claim 19, wherein the periphery of the cavity and the periphery of the through-hole are the same shape.

21. A MEMS transducer as claimed in claim 19, wherein the periphery of the cavity and the periphery of the through-hole are of different shapes.

22. A MEMS transducer as claimed in claim 21, wherein the periphery of the cavity comprises at least one convex and concave portion, and wherein the periphery of the through-hole has a circular or rectangular or pentagonal or octagonal shape.

23. A MEMS transducer as claimed in claim 1, comprising a plurality of supporting arms and corresponding convex and/or concave portions.

24. A MEMS transducer as claimed in claim 1, wherein the supporting arms are spaced evenly around the active central region of the membrane.

25. A MEMS transducer as claimed in claim 1, wherein the membrane is generally square or rectangular in shape.

26. A MEMS transducer as claimed in claim 1, wherein the active center region of the membrane is under intrinsic stress.

27. A method of fabricating a MEMS transducer, wherein said MEMS transducer comprises a MEMS transducer as claimed in claim 1.

28. A MEMS transducer structure comprising:
a substrate, the substrate comprising a cavity; and
a membrane layer supported relative to the substrate to provide a flexible membrane;
wherein:
    a peripheral edge of the cavity defines at least one perimeter region that is convex with reference to the center of the cavity;
    the peripheral edge of the cavity further defines at least one perimeter region that is concave with reference to the center of the cavity; and
    the concave portion in the periphery of the cavity comprises a radius of curvature that is smaller than the radius of curvature of another concave portion in the periphery of the cavity.

29. A MEMS transducer structure comprising:
a substrate, the substrate comprising a cavity; and
a membrane layer supported relative to the substrate to provide a flexible membrane, wherein the membrane layer comprises an active central region and a plurality of support arms which extend laterally from the active central region for supporting the active central region of the membrane;
wherein:
    a peripheral edge of the cavity defines at least first and second perimeter regions that are concave with reference to the center of the cavity;
    the at least first and second perimeter regions extend away from the centre of the cavity; and
    the at least first and second perimeter regions have a smaller radius of curvature compared to at least one other concave portion of the peripheral edge of the cavity.

30. A MEMS transducer as claimed in claim 29, wherein the at least first and second perimeter regions extend away from the centre of the cavity in a region corresponding to first and second edges of a supporting art of the membrane.

31. A MEMS transducer as claimed in claim 29, wherein the periphery of the cavity lies in a plane parallel to the surface of the substrate.

32. A MEMS transducer as claimed in claim 29, wherein said transducer comprises a capacitive sensor.

33. A MEMS transducer as claimed in claim 29, wherein said transducer comprises a microphone.

34. A MEMS transducer as claimed in claim 32, further comprising readout circuitry.

35. A MEMS transducer as claimed in claim 34, wherein the readout circuitry may comprise analogue and/or digital circuitry and/or other components.

36. A MEMS transducer as claimed in claim 29, wherein the transducer is located within a package having a sound port.

37. An electronic device comprising a MEMS transducer as claimed in claim 29.

38. An electronic device as claimed in claim 37, wherein said device is at least one of: a portable device; a battery powered device; an audio device; a computing device; a communications device; a personal media player; a mobile telephone; a games device; and a voice controlled device.

39. An integrated circuit comprising a MEMS transducer as claimed in claim 29 and readout circuitry.

* * * * *

UNITED STATES PATENT AND TRADEMARK OFFICE
CERTIFICATE OF CORRECTION

| | | |
|---|---|---|
| PATENT NO. | : 10,085,094 B2 | Page 1 of 1 |
| APPLICATION NO. | : 15/636121 | |
| DATED | : September 25, 2018 | |
| INVENTOR(S) | : Cargill, Jenkins and Boyd | |

It is certified that error appears in the above-identified patent and that said Letters Patent is hereby corrected as shown below:

In the Specification

1. In Column 3, Line 49, delete "though-hole" and insert -- through-hole --, therefor.

2. In Column 5, Line 19, delete "FIGS. 2a or 2b." and insert -- FIG. 1a or 1b. --, therefor.

3. In Column 11, Line 36, delete "though-hole" and insert -- through-hole --, therefor.

In the Claims

4. In Column 15, Line 5, in Claim 14, delete "though-hole" and insert -- through-hole --, therefor.

Signed and Sealed this
Ninth Day of April, 2019

Andrei Iancu
*Director of the United States Patent and Trademark Office*